United States Patent
Vakilian et al.

(10) Patent No.: US 11,054,447 B2
(45) Date of Patent: Jul. 6, 2021

(54) SYSTEM AND METHOD FOR CONTROLLING THE IMPACT OF PROCESS AND TEMPERATURE IN PASSIVE SIGNAL DETECTOR FOR AUTOMOTIVE ETHERNET

(71) Applicant: Avago Technologies International Sales Pte. Limited, Singapore (SG)

(72) Inventors: Kambiz Vakilian, Irvine, CA (US); Jingguang Wang, Irvine, CA (US); Vikrant Dhamdhere, Irvine, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 73 days.

(21) Appl. No.: 16/533,005

(22) Filed: Aug. 6, 2019

(65) Prior Publication Data
US 2020/0049741 A1 Feb. 13, 2020

Related U.S. Application Data

(60) Provisional application No. 62/718,221, filed on Aug. 13, 2018.

(51) Int. Cl.
*G01R 19/165* (2006.01)
*H04L 12/40* (2006.01)

(52) U.S. Cl.
CPC . *G01R 19/16504* (2013.01); *G01R 19/16576* (2013.01); *H04L 12/40* (2013.01); *H04L 2012/40273* (2013.01)

(58) Field of Classification Search
None
See application file for complete search history.

(56) References Cited

U.S. PATENT DOCUMENTS

| | | | |
|---|---|---|---|
| 2012/0223765 A1* | 9/2012 | Wang | G06F 1/3206 327/534 |
| 2012/0294055 A1* | 11/2012 | Kim | H03F 3/45179 363/127 |

OTHER PUBLICATIONS

Extended European Search Report on EP 19190392.1 dated Jan. 7, 2020 (9 pages).

* cited by examiner

*Primary Examiner* — Jas A Sanghera
(74) *Attorney, Agent, or Firm* — Foley & Lardner LLP (57) ABSTRACT

A system for controlling the impact of process and temperature in passive signal detector includes a voltage level detector, a first transistor with a drain electrically connected to a first input of the voltage level detector, and a second transistor with a drain electrically connected to a second input of the voltage level detector. The first transistor has a threshold voltage of a first voltage value. The threshold voltage corresponds to a minimum gate-to-source voltage to create a conducting path between source and drain terminals of a transistor. The second transistor has a threshold voltage of the first voltage value. An offset voltage is applied across a gate of the first transistor and a source of the second transistor, and applied across a gate of the second transistor and a source of the first transistor. A difference between a threshold voltage and the offset voltage is constant.

17 Claims, 6 Drawing Sheets

SYSTEM AND METHOD FOR CONTROLLING THE IMPACT OF PROCESS AND TEMPERATURE IN PASSIVE SIGNAL DETECTOR FOR AUTOMOTIVE ETHERNET

CROSS-REFERENCE TO RELATED APPLICATION

This application claims the benefit of and priority to U.S. Provisional Application No. 62/718,221, entitled "System and Method for Controlling the Impact of Process and Temperature in Passive Signal Detector for Automotive Ethernet," filed Aug. 13, 2018. U.S. Provisional Application No. 62/718,221 is hereby incorporated by reference herein in its entirety.

FIELD OF THE DISCLOSURE

This disclosure generally relates to systems and methods for controlling the impact of process and temperature in passive signal detector for automotive Ethernet, including but not limited to systems and methods for controlling the impact of the impact of process and temperature in passive signal detector.

BACKGROUND OF THE DISCLOSURE

A threshold for passive signal detection may be inaccurate due to process and temperature variations. To reduce power consumption in automotive electronics, it is desired to place inactive devices in sleep mode. Automotive Ethernet transceivers may use low power signal detectors to enable or disable the device. In ultra-low power signal detectors, a simple transistor "turn on" threshold voltage (Vth) may be used as a voltage reference to detect presence of signal energy. The large variation of Vth may cause inaccurate signal detection because Vth varies with temperature and process. This problem may be solved by using extra control cables from a central unit for power on/off. However, such dedicated power on/off control cables add extra cost and weight. Ultra-low power "always-on" signal detector may be used to eliminate the need for extra power control cable. Examples of related art include U.S. Pat. No. 8,977,869 B2. Improvements in systems and methods for controlling the impact of process and temperature in passive signal detector still remain desired.

SUMMARY

Various embodiments disclosed herein are related to a system for process and temperature compensated passive signal detection. In some embodiments, the system may include a voltage level detector, a first transistor and a second transistor. The first transistor may have a drain electrically connected to a first input of the voltage level detector, and have a threshold voltage of a first voltage value, where a threshold voltage corresponds to a minimum gate-to-source voltage to create a conducting path between source and drain terminals of a transistor. The second transistor may have a drain electrically connected to a second input of the voltage level detector, and have a threshold voltage of the first voltage value. An offset voltage is applied across a gate of the first transistor and a source of the second transistor, and the offset voltage is applied across a gate of the second transistor and a source of the first transistor. A difference between a threshold voltage of the first voltage value and the offset voltage may be constant.

In some embodiments, the offset voltage may be produced using a third transistor and a fourth transistor each having a threshold voltage of the first voltage value, a supply voltage, and a plurality of resistors. The offset voltage may be produced across a drain of the third transistor and a source of the fourth transistor. The drain of the third transistor may be connected to a gate of the third transistor. The drain of the fourth transistor may be connected to a gate of the fourth transistor. The plurality of resistors may include a first pair of resistors each with resistance of a first resistance value, a second pair of resistors each with resistance of a second resistance value, and a third pair of resistors each with resistance of a third resistance value. In some embodiments, the offset voltage may be configured to be process and temperature dependent.

Various embodiments disclosed herein are related to a method for performing process and temperature compensated passive signal detection. Performing process and temperature compensated passive signal detection may include electrically connecting a drain of a first transistor to a first input of a voltage level detector, the first transistor having a threshold voltage of a first voltage value, where a threshold voltage corresponds to a minimum gate-to-source voltage to create a conducting path between source and drain terminals of a transistor. Performing process and temperature compensated passive signal detection may include electrically connecting a drain of a second transistor to a second input of the voltage level detector, the second transistor having a threshold voltage of the first voltage value. Performing process and temperature compensated passive signal detection may include applying an offset voltage across a gate of the first transistor and a source of the second transistor, and applying the offset voltage across a gate of the second transistor and a source of the first transistor. A difference between a threshold voltage of the first voltage value and the offset voltage may be constant.

In some embodiments, performing process and temperature compensated passive signal detection may further include producing the offset voltage using a third transistor and a fourth transistor each having a threshold voltage of the first voltage value, a supply voltage, and a plurality of resistors. Performing process and temperature compensated passive signal detection may further include producing the offset voltage across a drain of the third transistor and a source of the fourth transistor. Performing process and temperature compensated passive signal detection may further include connecting the drain of the third transistor to a gate of the third transistor. Performing process and temperature compensated passive signal detection may further include connecting the drain of the fourth transistor to a gate of the fourth transistor. In some embodiments, the plurality of resistors may inculde a first pair of resistors each with resistance of a first resistance value, a second pair of resistors each with resistance of a second resistance value, and a third pair of resistors each with resistance of a third resistance value. In some embodiments, the offset voltage is configured to be process and temperature dependent.

Various embodiments disclosed herein are related to circuitry including voltage level detector circuitry, a first transistor and a second transistor. The voltage level detector circuitry may be configured to detect a voltage level. The first transistor may have a drain electrically connected to a first input of the voltage level detector circuitry, and have a threshold voltage of a first voltage value, wherein a threshold voltage corresponds to a minimum gate-to-source voltage to create a conducting path between source and drain terminals of a transistor. The second transistor may have a drain electrically connected to a second input of the voltage level detector circuitry, and have a threshold voltage of the first voltage value, where an offset voltage is applied across a gate of the first transistor and a source of the second transistor. The offset voltage may be applied across a gate of the second transistor and a source of the first transistor, and a difference between a threshold voltage of the first voltage value and the offset voltage may be constant.

In some embodiments, the offset voltage may be produced using a third transistor and a fourth transistor each having a threshold voltage of the first voltage value, a supply voltage, and a plurality of resistors. The offset voltage may be produced across a drain of the third transistor and a source of the fourth transistor. The drain of the third transistor may be connected to a gate of the third transistor. The drain of the fourth transistor may be connected to a gate of the fourth transistor. The plurality of resistors may include a first pair of resistors each with resistance of a first resistance value, a second pair of resistors each with resistance of a second resistance value, and a third pair of resistors each with resistance of a third resistance value.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems and methods for controlling the impact of process and temperature in passive signal detectors.

A. Computing and Network Environment

Figure 1A:
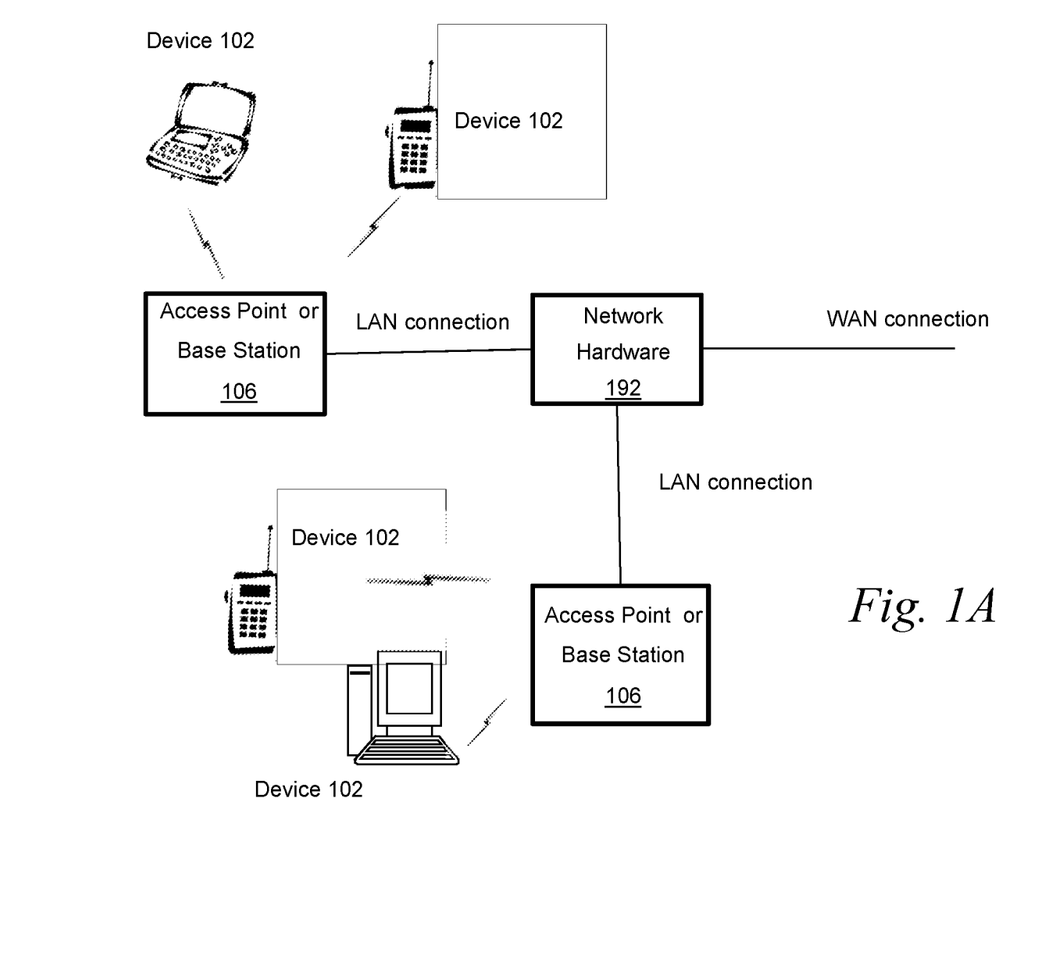
FIG. 1A is a block diagram depicting an embodiment of a network environment including one or more wireless communication devices in communication with one or more devices or stations.

Prior to discussing specific embodiments of the present solution, aspects of a possible operating environment as well as associated system components (e.g., hardware elements) are described in connection with the methods and systems described herein. Referring to FIG. 1A, an embodiment of a network environment is depicted. In brief overview, the network environment includes a wireless communication system that includes one or more base stations 106, one or more wireless communication devices 102 and a network hardware component 192. The wireless communication devices 102 can for example include laptop computers 102, tablets 102, personal computers 102 and/or cellular telephone devices 102. The details of an embodiment of each wireless communication device and/or base station are described in greater detail with reference to FIGS. 1B and 1C. The network environment can be an ad hoc network environment, an infrastructure wireless network environment, a subnet environment, etc., in one embodiment.

Terms such as "wireless communication device", "user equipment," "mobile station," "mobile," "mobile device," "subscriber station," "subscriber equipment," "access terminal," "terminal," "handset," and similar terminology, can refer to a wireless device utilized by a subscriber or user of a wireless communication service to receive or convey data, control, voice, video, sound, gaming, or substantially any data-stream or signaling-stream. The foregoing terms can be utilized interchangeably in the present disclosure. Likewise, terms such as "access point (AP)," "wireless access point (WAP)," "base station," "base transceiver station", "Node B," "evolved Node B (eNode B or eNB)," home Node B (HNB)," "home access point (HAP)," and similar terminology, can be utilized interchangeably in the present disclosure, and refer to a wireless network component or apparatus that serves and receives data, control, voice, video, sound, gaming, or substantially any data-stream or signaling-stream from a set of wireless devices.

Referring again to FIG. 1A, the base stations 106 can be operably coupled to the network hardware 192 via local area network connections. The network hardware 192, which can include a router, gateway, switch, bridge, modem, system controller, appliance, etc., can provide a local area network connection for the communication system. Each of the base stations 106 can have an associated antenna or an antenna array to communicate with the wireless communication devices 102 in its area. The wireless communication devices 102 can register with a particular access point 106 to receive services from the communication system (e.g., via a SU-MIMO or MU-MIMO configuration). For direct connections (e.g., point-to-point communications), some wireless communication devices 102 can communicate directly via an allocated channel and communications protocol. Some of the wireless communication devices 102 can be mobile or relatively static with respect to the access point 106.

In one or more embodiments, a base station 106 includes a device or module (including a combination of hardware and software) that allows wireless communication devices 102 to connect to a wired network using LTE, Wi-Fi, and/or other standards. A base station 106 can be implemented, designed and/or built for operating in a wireless local area network (WLAN), such as in a cellular network. A base station 106 can connect to a router (e.g., via a wired network) as a standalone device in one or more embodiments. In other embodiments, a base station can be a component of a router. A base station 106 can provide multiple devices 102 access to a network. A base station 106 can, for example, connect to a wired Ethernet connection and provide wireless connections using radio frequency links for other devices 102 to utilize that wired connection. A base station 106 can be built and/or implemented to support a standard for sending and receiving data using one or more radio frequencies. Those standards and the frequencies they use can be defined by the IEEE or 3GPP for example. A base station 106 can be implemented and/or used to support cellular coverage, public Internet hotspots, and/or on an internal network to extend the network's signal (e.g., Wi-Fi) range.

In one or more embodiments, the base stations 106 can be used for (e.g., in-home or in-building) wireless networks (e.g., IEEE 802.11, Bluetooth, ZigBee, cellular, any other type of radio frequency based network protocol and/or variations thereof). Each of the wireless communication devices 102 can include a built-in radio and/or is coupled to a radio. Such wireless communication devices 102 and/or base stations 106 can operate in accordance with the various aspects of the disclosure as presented herein to enhance performance, reduce costs and/or size, and/or enhance broadband applications. Each wireless communication devices 102 can have the capacity to function as a client node seeking access to resources (e.g., data, and connection to networked nodes such as servers) via one or more base stations 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In one or more embodiments, different types of data can be transmitted via different protocols. In other embodiments, the same types of data can be transmitted via different protocols.

Figure 1B:
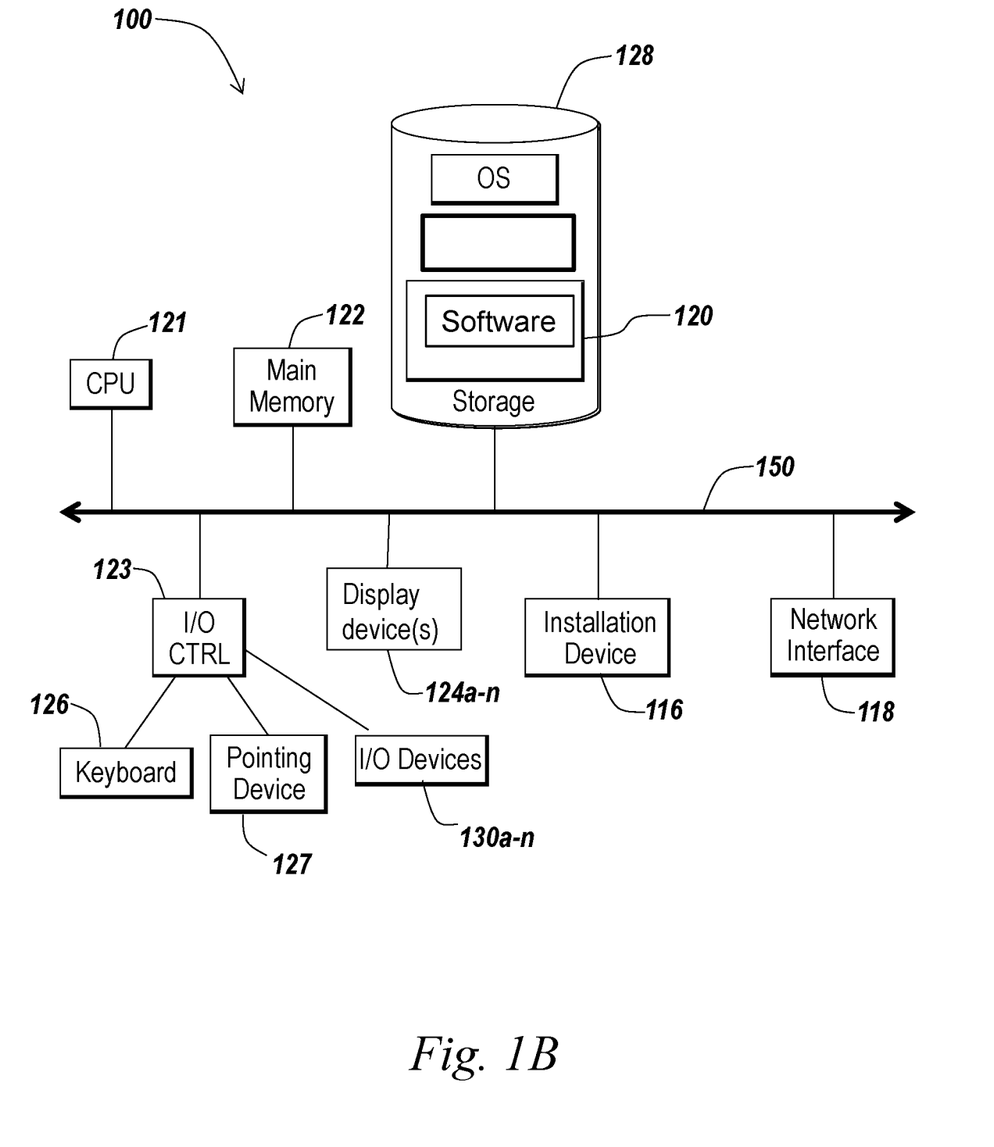
FIGS. 1B and 1C are block diagrams depicting embodiments of computing devices useful in connection with the methods and systems described herein.
Figure 1C:
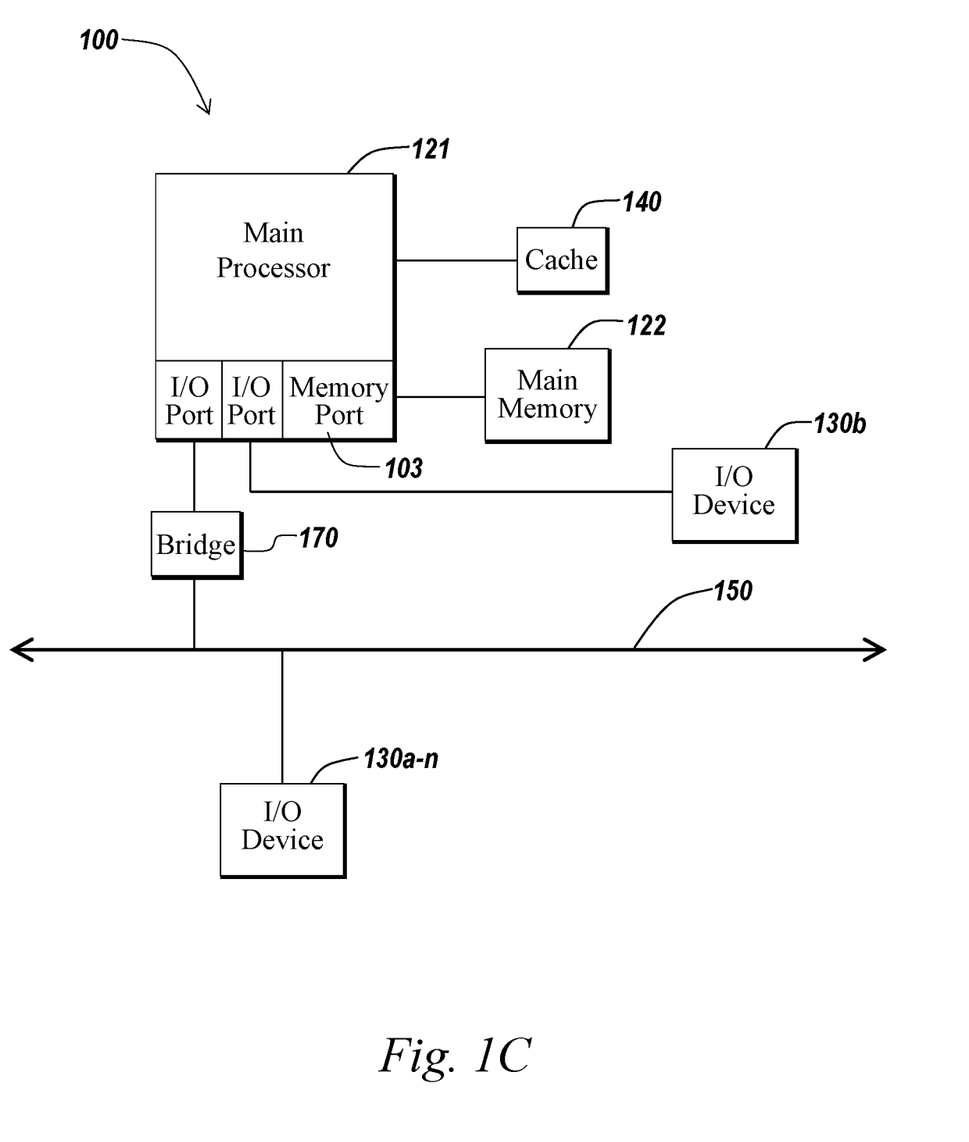

The communications device(s) 102 and base station(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or the base station 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include, without limitation, an operating system and/or software. As shown in FIG. 1C, each computing device 100 can also include additional optional elements, such as a memory port 103, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, Calif.; those manufactured by International Business Machines of White Plains, N.Y.; those manufactured by ARM Holdings, plc of Cambridge, England. or those manufactured by Advanced Micro Devices of Sunnyvale, Calif. The computing device 100 can be based on any of these processors, or any other processor capable of operating as described herein.

Main memory unit 122 can be one or more memory chips capable of storing data and allowing any storage location to be directly accessed by the microprocessor 121, such as any type or variant of Static random access memory (SRAM), Dynamic random access memory (DRAM), Ferroelectric RAM (FRAM), NAND Flash, NOR Flash and Solid State Drives (SSD).

The main memory 122 can be based on any of the above described memory chips, or any other available memory chips capable of operating as described herein. In the embodiment shown in FIG. 1B, the processor 121 communicates with main memory 122 via a system bus 150 (described in more detail below). FIG. 1C depicts an embodiment of a computing device 100 in which the processor communicates directly with main memory 122 via a memory port 103. For example, in FIG. 1C the main memory 122 can be DRDRAM.

FIG. 1C depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the processor 121 communicates with various I/O devices 130a-n via a local system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 121 can use an Advanced Graphics Port (AGP) to communicate with the display 124. FIG. 1C depicts an embodiment of a computer 100 in which the main processor 121 can communicate directly with I/O device 130b, for example via HYPERTRANSPORT, RAPIDIO, or INFINIBAND communications technology. FIG. 1C also depicts an embodiment in which local busses and direct communication are mixed: the processor 121 communicates with I/O device 130a using a local interconnect bus while communicating with I/O device 131 directly.

A wide variety of I/O devices 130a-n and 131 can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices 130a-n can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, Calif.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., built and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax, LTE, LTE-A and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In one or more embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In one or more embodiments, any portion of the operating system of the computing device 100 can be implemented for using multiple displays 124a-124n. One ordinarily skilled in the art will recognize and appreciate the various ways and embodiments that a computing device 100 can be implemented to have one or more display devices 124a-124n.

In further embodiments, an I/O device 130a-n can be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 100 can be any workstation, telephone, sensor, desktop computer, laptop or notebook computer, server, handheld computer, mobile telephone, or other portable telecommunications device, media playing device, a gaming system, mobile computing device, or any other type and/or form of computing, telecommunications or media device that is capable of communication. The computer system 100 has sufficient processor power and memory capacity to perform the operations described herein.

In one or more embodiments, the computing device 100 can have different processors, operating systems, and input devices consistent with the device. For example, in one embodiment, the computing device 100 is a smart phone, mobile device, tablet or personal digital assistant. In still other embodiments, the computing device 100 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Controlling the Impact of Process and Temperature in Passive Signal Detectors Described herein are systems and methods for controlling (e.g., compensating for) the impact of process and temperature in a passive signal detector in one or more embodiments. In ultra-low power signal detectors, a signal is detected when an incoming signal voltage (Vsig) is greater than or equal to a simple transistor "turn on" threshold voltage (Vth). Use of such a single transistor threshold voltage (Vth) as the reference for signal detection may vary significantly due to process and temperature, in one or more embodiments. For example, when Vth is lower than a nominal value, noise immunity may degrade, e.g., lower Vth may degrade noise immunity. On the other hand, when Vth is higher than a nominal value, signal may be undetected (e.g., higher Vth may limit a signal detection level), in one or more embodiments.

To improve the precision of signal detection, in one or more embodiments, an offset voltage (e.g., VC_OS) is applied, produced, generated, and/or provided to an input to a signal detector. The offset voltage preloads the signal detector input and reduce the minimum required input signal to trigger the detection, in one or more embodiments. The offset voltage is configured to be process dependent and configured to counter the impact of the threshold voltage (Vth) variation so that a new signal detection threshold (e.g., Vth−VC_OS) can be process and temperature independent, in one or more embodiments.

In some aspects, the present disclosure provides embodiments of a system for process and temperature compensated passive signal detection, includes a voltage level detector, a first transistor (e.g., transistor 220) with a drain electrically connected or coupled to a first input of the voltage level detector, and a second transistor (e.g., transistor 230) with a drain electrically connected or coupled to a second input of the voltage level detector, in one or more embodiments. The first transistor (e.g., transistor 220) has a threshold voltage of a first voltage value (e.g., Vth in voltage value), in one or more embodiments. The threshold voltage corresponds to a minimum gate-to-source voltage to create a conducting path between source and drain terminals of a transistor, in one or more embodiments. The second transistor (e.g., transistor 230) has a threshold voltage of the first voltage value (e.g., Vth in voltage value), in one or more embodiments. An offset voltage is applied, produced, generated, and/or provided across a gate of the first transistor (e.g., transistor 220) and a source of the second transistor (e.g., transistor 230), and applied, produced, generated, and/or provided across a gate of the second transistor (e.g., transistor 230) and a source of the first transistor (e.g., transistor 220), in one or more embodiments. The offset voltage is implemented using a third transistor (e.g., transistor 320) and a fourth transistor (e.g., transistor 330) each having a threshold voltage of the first voltage value (e.g., Vth in voltage value), a supply voltage, and a plurality of resistors, in one or more embodiments. The offset voltage is produced, output, and/or generated across a drain of the third transistor (e.g., transistor 320) and a source of the fourth transistor (e.g., transistor 330), in one or more embodiments. The drain of the third transistor (e.g., transistor 320) is connected to a gate of the third transistor (e.g., transistor 320), in one or more embodiments. The drain of the fourth transistor (e.g., transistor 330) is connected to a gate of the fourth transistor (e.g., transistor 330), in one or more embodiments. The plurality of resistors includes a first pair of resistors each with resistance of a first resistance value (e.g., R1 in resistance value), a second pair of resistors each with resistance of a second resistance value (e.g., R2 in resistance value), and a third pair of resistors each with resistance of a third resistance value (e.g., R3 in resistance value), in one or more embodiments. The offset voltage is configured to be process and temperature dependent, in one or more embodiments.

In one or more embodiments, the disclosure is directed to a method for process and temperature compensated passive signal detection. The method includes electrically connecting or coupling a drain of a first transistor (e.g., transistor 220) with to a first input of a voltage level detector. The first transistor (e.g., transistor 220) has a threshold voltage of a first voltage value (e.g., Vth in voltage value), in one or more embodiments. The threshold voltage corresponds to a minimum gate-to-source voltage to create a conducting path between source and drain terminals of a transistor, in one or more embodiments. The method includes electrically connecting a drain of a second transistor (e.g., transistor 230) to a second input of the voltage level detector, in one or more embodiments. The second transistor (e.g., transistor 230) has a threshold voltage of the first voltage (e.g., Vth in voltage value), in one or more embodiments. The method includes applying, producing, establishing, generating, and/or providing an offset voltage across a gate of the first transistor (e.g., transistor 220) and a source of the second transistor (e.g., transistor 230). The method includes applying, producing, establishing, generating, and/or providing the offset voltage across a gate of the second transistor (e.g., transistor 230) and a source of the first transistor (e.g., transistor 220), in one or more embodiments. The method further includes applying, producing, establishing, generating, and/or providing the offset voltage using a third transistor (e.g., transistor 320) and a fourth transistor (e.g., transistor 330) each having a threshold voltage of the first voltage value (e.g., Vth in voltage value), a supply voltage, and a plurality of resistors, in one or more embodiments. The method further includes producing, generating, outputting and/or providing the offset voltage across a drain of the third transistor (e.g., transistor 320) and a source of the fourth transistor (e.g., transistor 330), in one or more embodiments. The method further includes connecting the drain of the third transistor (e.g., transistor 320) to a gate of the third transistor (e.g., transistor 320), in one or more embodiments. The method further includes connecting the drain of the fourth transistor (e.g., transistor 330) to a gate of the fourth transistor (e.g., transistor 330), in one or more embodiments. The plurality of resistors include a first pair of resistors each with resistance of a first resistance value (e.g., R1 in resistance value), a second pair of resistors each with resistance of a second resistance value (e.g., R2 in resistance value), and a third pair of resistors each with resistance of a third resistance value (e.g., R3 in resistance value), in one or more embodiments. The offset voltage is configured to be process and temperature dependent, in one or more embodiments.

Configurations according to one or more embodiments can have various advantageous effects as follows. First, as advantageous effects on a circuit (circuit advantages), low power passive energy detection can be performed with a precise threshold which is not sensitive to any process and temperature variation. There is no need for active amplifiers, comparators or accurate voltage reference generators. Low power passive energy detection can be performed with reduced design complexity and improved circuit robustness. Second, as advantageous effects on a system (system advantages), an accurate signal detection threshold can be designed to reliably meet multiple system signal levels. Such a stable signal detection threshold can improve noise immunity in a noisy automotive environment. Moreover, the ultra-low power passive circuit can extend the automobile's battery life. Third, as advantageous effects on products (product advantages), low power, simple and accurate signal detection for automotive communication products can be performed. Fourth, the ultra-low power passive circuit can provide accuracy and consistency into signal detection without increasing power consumption. Therefore, when used in the automotive industry, power leakage in the cars can be reduced while maintaining precision. Fifth, accurate and low power signal detection according to one or more embodiments can apply to any low power battery powered communication device including automotive, Internet of things (IOT) and hand held devices.

Figure 2:
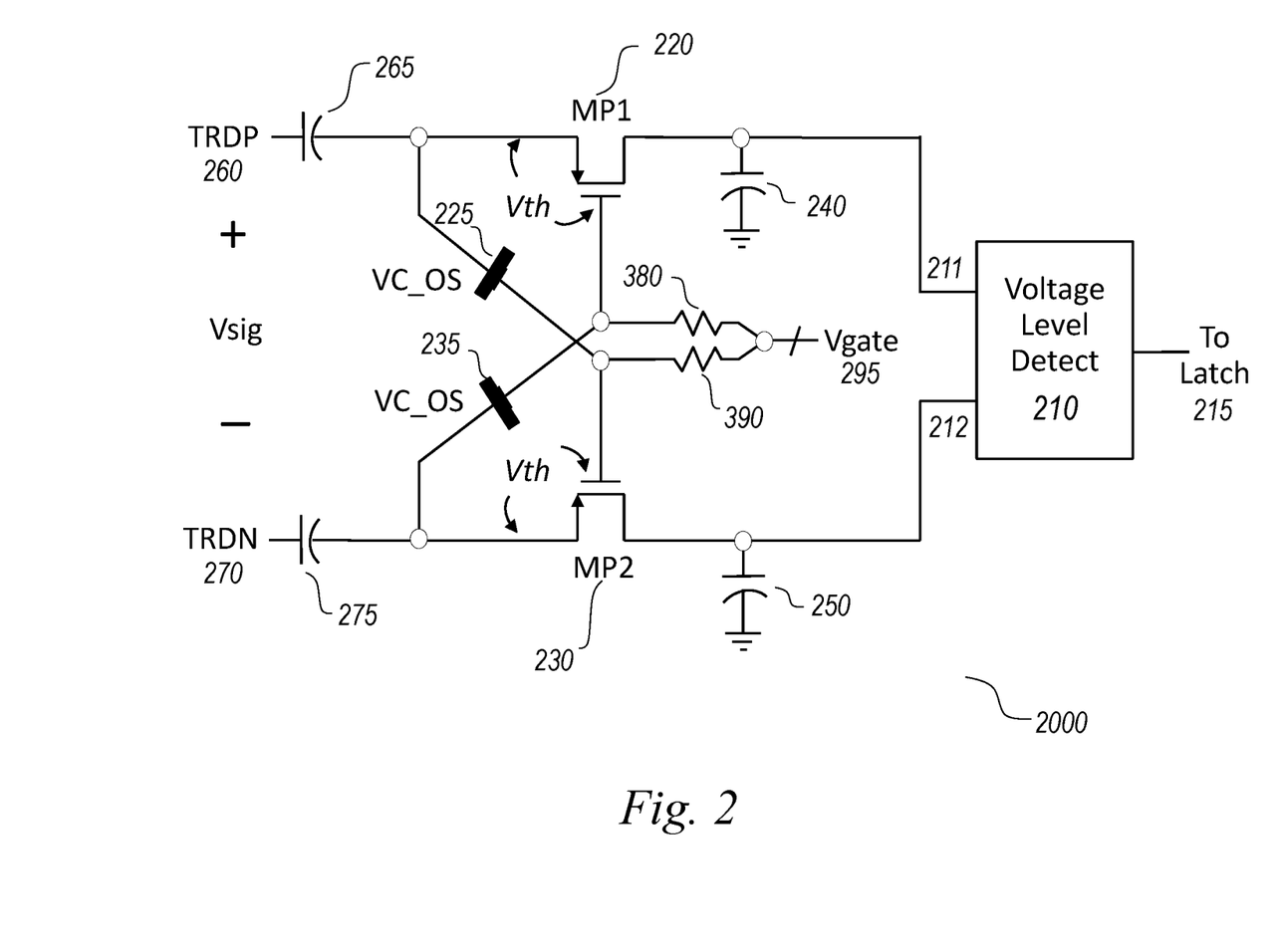
FIG. 2 is a block diagram depicting an embodiment of a system for controlling the impact of process and temperature in a passive signal detector in some embodiments.

FIG. 2 shows an illustrative embodiment of a system 2000 for controlling (e.g., compensating for) the impact of process and temperature in a passive signal detector in one or more embodiments.

In one or more embodiments, the system 2000 includes a passive signal detector configured to compensate for the impact of process and temperature in detecting input signals. In one or more embodiments, the system 2000 includes a voltage level detector 210, a first transistor 220 (MP1) with a drain electrically connected to a first input 211 of the voltage level detector 210, and a second transistor 230 (MP2) with a drain electrically connected to a second input 212 of the voltage level detector 210. In one or more embodiments, the system 2000 may be circuitry (e.g., an electronic device or a semiconductor-based device or an electric circuit, or a circuit or system of circuits performing a particular function in an electronic device) including voltage level detector circuitry as the voltage level detector 210, e.g., circuitry configured to detect a voltage level. A latch signal is generated, output or produced by the voltage level detector 210 to turn on a latch circuit 215 (not illustrated), in one or more embodiments. A capacitor 240 is connected or coupled between the drain of the transistor MP1 and ground, in one or more embodiments. A capacitor 250 is connected or coupled between the drain of the transistor MP2 and ground, in one or more embodiments. In one or more embodiments, at least one of the capacitor 240 or the capacitor 250 may be a polarized capacitor. An incoming voltage signal Vsig is received at a pair of terminals, e.g., a positive terminal 260 (TRDP) and a negative terminal 270 (TRDN), in one or more embodiments. In one or more embodiments, a capacitor 265 is connected between the terminal TRDP and a source of the transistor MP1. A capacitor 275 is connected between the terminal TRDN and a source of the transistor MP2, in one or more embodiments. In one or more embodiments, a gate voltage Vgate is applied to the gates of the transistors MP1 and MP2 via a resistor 380 and a resistor 390, respectively.

In one or more embodiments, each of the first and second transistors MP1 and MP2 includes or corresponds to a PMOS-FET. In one or more embodiments, each of the first and second transistors MP1 and MP2 includes or corresponds to an NMOS-FET. The first transistor MP1 has a threshold voltage of a first voltage value (e.g., Vth in voltage value). The threshold voltage Vth corresponds to a minimum gate-to-source voltage to create a conducting path between source and drain terminals of a transistor (e.g., the transistor MP1). The second transistor MP2 has a threshold voltage of the first voltage value (e.g., Vth in voltage value), in one or more embodiments. An offset voltage 235 (VC_OS) is applied across a gate of the first transistor MP1 and a source of the second transistor MP2, in one or more embodiments. An offset voltage 225 (VC_OS) is applied across a gate of the second transistor MP2 and a source of the first transistor MP1, in one or more embodiments. In one or more embodiments, the offset voltage 225 is the same as the offset voltage 235.

With the configuration illustrated in FIG. 2, the offset voltage 225 is applied across the gate of the second transistor MP2 and the source of the first transistor MP1, in one or more embodiments so that the offset voltage 225 preloads the signal detector input and reduces the minimum required input signal to trigger the detection (e.g., the reduced minimum required input signal or new signal detection threshold is (Vth−VC_OS)). Similarly, the offset voltage 235 is applied across the gate of the first transistor MP1 and the source of the second transistor MP2, in one or more embodiments so that the offset voltage 235 preloads the signal detector input and reduces the minimum required input signal to trigger, initiate or enable the detection (e.g., the reduced minimum required input signal or new signal detection threshold is (Vth−VC_OS)). In one or more embodiments, the new signal detection threshold (Vth−VC_OS) is process and temperature independent by designing the offset voltage VC_OS to counter or compensate for Vth variation effect, thereby improving the precision of signal detection. This will be described in the following sections with reference to FIG. 3.

Figure 3:
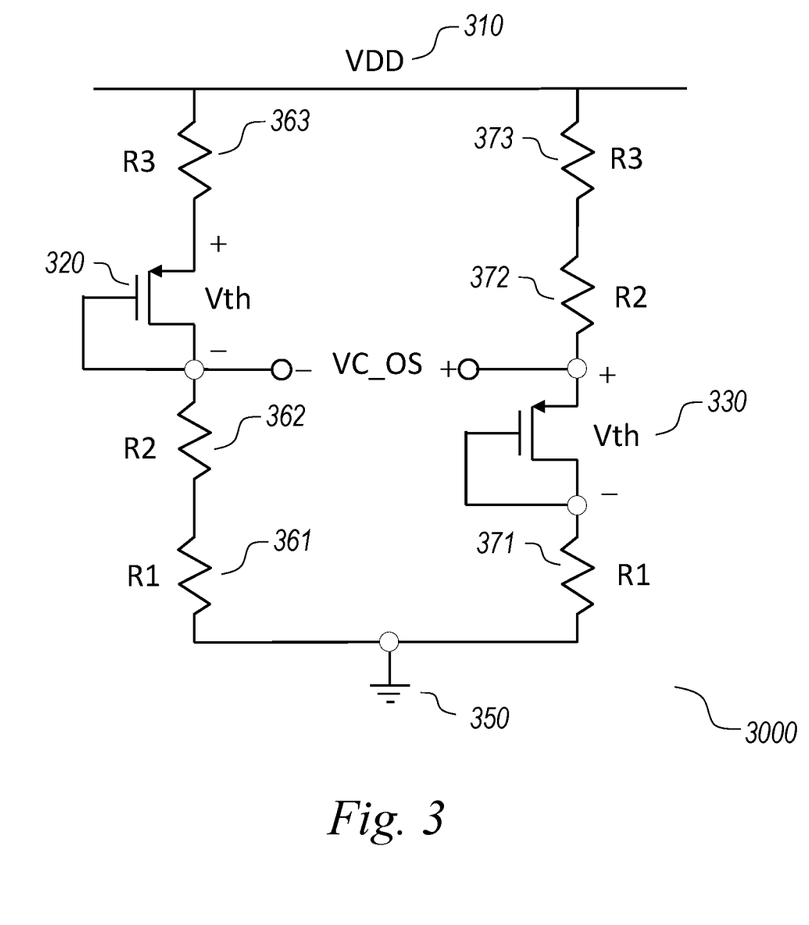
FIG. 3 is a block diagram depicting an embodiment of a system for controlling the impact of process and temperature in a passive signal detector in some embodiments.

FIG. 3 shows an illustrative embodiment of a system 3000 for controlling (e.g., compensating for) the impact of process and temperature in a passive signal detector in one or more embodiments.

In one or more embodiments, the system 3000 is a voltage generator configured to generate an offset voltage VC_OS (e.g., the offset voltage 225 or 235 in FIG. 2). In one or more embodiments, the offset voltage VC_OS is process and temperature dependent such that the offset voltage VC_OS can track the changes of transistor threshold voltage due to process and temperature variations. In one or more embodiments, the system 3000 includes a third transistor 320 and a fourth transistor 330 each having a threshold voltage of the first voltage (e.g., Vth in voltage value). The system 300 includes a supply (or supply voltage) 310 (VDD) and a plurality of resistors including a first pair of resistors 361, 362, a second pair of resistors 363, 371, and a third pair of resistors 372, 373, in one or more embodiments. In one or more embodiments, each of the first pair of resistors 361 and 371 has the same resistance of the first resistance value (e.g., R1 in resistance value). In one or more embodiments, each of the second pair of resistors 362 and 372 has the same resistance of the second resistance value (e.g., R2 in resistance value). In one or more embodiments, each of the third pair of resistors 363 and 373 has the same resistance of the third resistance value (e.g., R3 in resistance value).

In one or more embodiments, the system 3000 includes two ladders (or circuit paths) from the supply 310 to ground 350 with identical components (and different arrangement sequence) in each ladder. For example, in the first ladder, the drain of the third transistor 320 is connected to a gate of the third transistor 320, in one or more embodiments. A source of the third transistor 320 is connected to the supply 310 via the resistor 363, in one or more embodiments. The drain of the third transistor 320 is connected to ground 350 via the resistor 362 and the resistor 361, in one or more embodiments. In the second ladder, the drain of the fourth transistor 330 is connected to a gate of the fourth transistor 330, in one or more embodiments. A source of the fourth transistor 330 is connected to the supply 310 via the resistor 372 and the resistor 373, in one or more embodiments. The drain of the fourth transistor 330 is connected to the ground 350 via the resistor 371, in one or more embodiments.

In one or more embodiments, the offset voltage VC_OS is produced, output and/or generated across the drain of the third transistor 320 and the source of the fourth transistor 330. The offset voltage generated in this manner is configured to be process and temperature dependent, in one or more embodiments so that the difference between the threshold voltage and the offset voltage is a constant, e.g., process and temperature independent.

As shown in the FIG. 3, $$VC\_OS = Vth - \Delta \qquad \text{(Equation 1)},$$

where Δ is a fraction of VDD, e.g., a constant that is independent of process and temperature while VC_OS tracks the variation in Vth.

$$\text{Signal detector voltage (or detection threshold)} = Vth - (Vth - \Delta) = \Delta \quad \text{(Equation 2)}.$$

That is, when the voltage VC_OS is added to the signal detector transistor, the voltage VC_OS can make the detection threshold to be constant (Δ) which is a value with signal detection threshold variation removed and therefore is process and temperature independent. In other words, a difference between a threshold voltage of Vth and the offset voltage VC_OS can be constant so as to remove a variation of Vth.

The detection threshold Δ can be a function of supply voltage VDD and resistor ratios (see Equation 6) for the following reasons.

$$VC\_OS = Vth + I \cdot R1 - I \cdot (R1 + R2) = Vth - I \cdot R2. \quad \text{(Equation 3)}$$

$$(\text{for } VDD \gg Vth) \; I = \frac{VDD - Vth}{R1 + R2 + R3} \simeq \frac{VDD}{R1 + R2 + R3}. \quad \text{(Equation 4)}$$

$$VC\_OS \simeq Vth - VDD \frac{R2}{R1 + R2 + R3}. \quad \text{(Equation 5)}$$

$$\Delta = Vth - VC\_OS \simeq VDD \frac{R2}{R1 + R2 + R3}. \quad \text{(Equation 6)}$$

Figure 4:
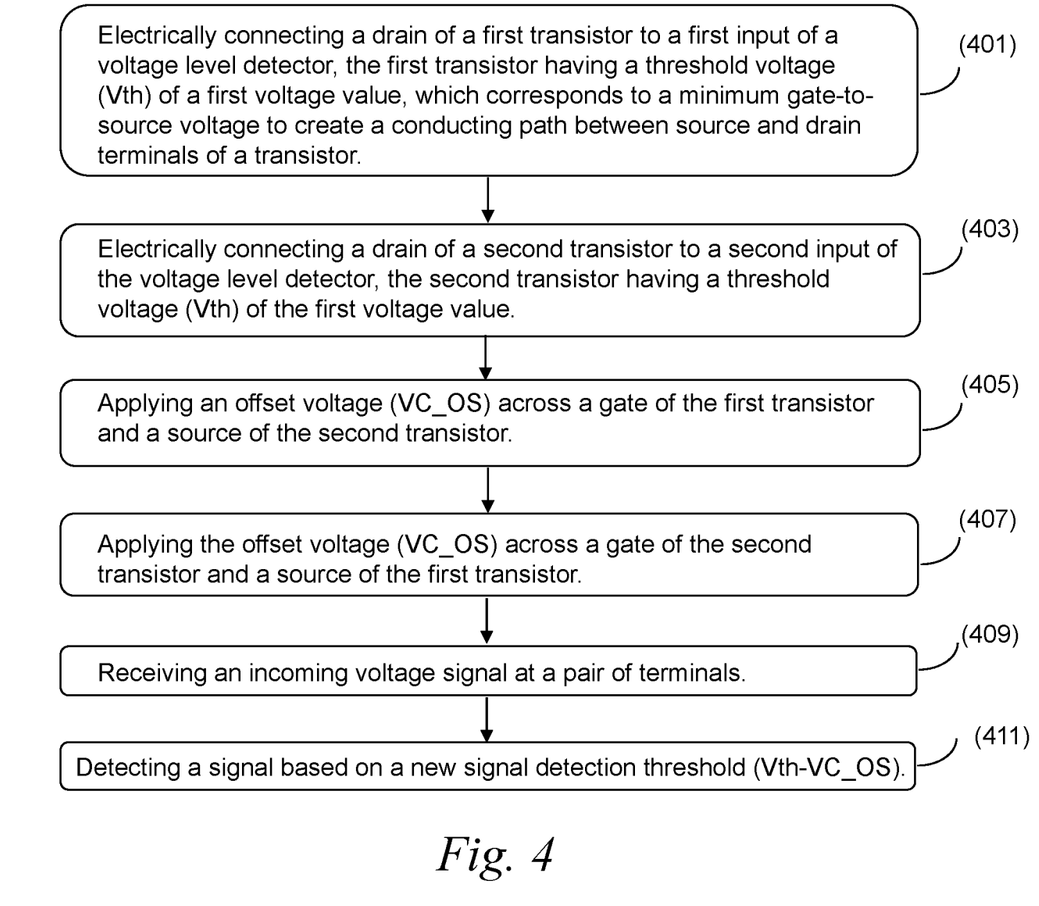
FIG. 4 is a flow diagram depicting an embodiment of a method for controlling the impact of process and temperature in a passive signal detector in some embodiments.

In FIG. 4, one illustrative embodiment of a method for controlling (e.g., compensating for) the impact of process and temperature in a passive signal detector is depicted. In one or more embodiments, the method includes electrically connecting a drain of a first transistor to a first input of a voltage level detector, the first transistor having a threshold voltage of a first voltage value (e.g., Vth in voltage value) (operation 401). In one or more embodiments, a drain of a second transistor is electrically connected to a second input of the voltage level detector, the second transistor having a threshold voltage of the first voltage value (e.g., Vth in voltage value) (operation 403). In one or more embodiments, an offset voltage (e.g., VC_OS) across a gate of the first transistor and a source of the second transistor is applied (operation 405). In one or more embodiments, the offset voltage across a gate of the second transistor and a source of the first transistor is aplied (operation 407). In one or more embodiments, an incoming voltage signal (e.g., Vsig) is received at a pair of terminals (operation 409). In one or more embodiments, a signal is detected based on a new signal detection threshold voltage (e.g., Vth-VC_OS).

Referring now to operation 401, and in one or more embodiments, a drain of a first transistor (e.g., the transistor MP1 in FIG. 2) is electrically connected to a first input of a voltage level detector (e.g., the voltage level detector 201 in FIG. 2), the first transistor having a threshold voltage of a first voltage value (e.g., Vth in voltage value). The threshold voltage corresponds to a minimum gate-to-source voltage to create a conducting path between source and drain terminals of a transistor, in one or more embodiments. In one or more embodiments, referring to FIG. 2, a system 2000 may include the voltage level detector 210 and the first transistor 220 (MP1) with the drain electrically connected to a first input 211 of the voltage level detector 210. In one or more embodiments, a latch signal may be generated, output or produced by the voltage level detector 210 to turn on a latch circuit 215 (not illustrated). A capacitor 240 may be connected or coupled between the drain of the transistor MP1 and ground, in one or more embodiments. In one or more embodiments, the capacitor 240 may be a polarized capacitor. In one or more embodiments, a capacitor 265 may be connected between the terminal TRDP and a source of the transistor MP1. In one or more embodiments, a gate voltage Vgate may be applied to the gate of the transistor MP1 via a resistor 380.

Referring now to operation 403, and in one or more embodiments, a drain of a second transistor (e.g., the transistor MP2 in FIG. 2) is electrically connected to a second input of the voltage level detector (e.g., the voltage level detector 201 in FIG. 2), the second transistor having a threshold voltage of the first voltage value (e.g., Vth in voltage value). In one or more embodiments, referring to FIG. 2, the system 2000 may the second transistor 230 (MP2) with the drain electrically connected to a second input 212 of the voltage level detector 210. A capacitor 250 may be connected or coupled between the drain of the transistor MP2 and ground, in one or more embodiments. In one or more embodiments, the capacitor 250 may be a polarized capacitor. A capacitor 275 may be connected between the terminal TRDN and a source of the transistor MP2, in one or more embodiments. In one or more embodiments, a gate voltage Vgate may be applied to the gate of the transistor MP2 via a resistor 390.

Referring now to operation 405, and in one or more embodiments, an offset voltage (e.g., VC_OS 235 in FIG. 2) is applied across a gate of the first transistor (e.g., the transistor MP1 in FIG. 2) and a source of the second transistor (e.g., the transistor MP2 in FIG. 2). In one or more embodiments, the method further includes applying, producing, establishing, generating, and/or providing the offset voltage using a third transistor (e.g., the transistor 320 in FIG. 3) and a fourth transistor (e.g., the transistor 330 in FIG. 3) each having a threshold voltage of the first voltage value (e.g., Vth in voltage value), a supply voltage (e.g., the supply voltage VDD in FIG. 3), and a plurality of resistors (e.g., the resistors 361, 362, 363, 371, 372, 373 in FIG. 3). The method further includes connecting the drain of the third transistor (e.g., the transistor 320 in FIG. 3) to a gate of the third transistor, in one or more embodiments. The method further includes connecting the drain of the fourth transistor (e.g., the transistor 330 in FIG. 3) to a gate of the fourth transistor, in one or more embodiments. The plurality of resistors include a first pair of resistors each with resistance of the first resistance value (e.g., R1 in resistance value) (e.g., the resistors 361 and 371 in FIG. 3), a second pair of resistors each with resistance of the second resistance value (e.g., R2 in resistance value) (e.g., the resistors 362 and 372 in FIG. 3), and a third pair of resistors each with resistance of a third resistance value (e.g., R3 in resistance value) (e.g., the resistors 363 and 373 in FIG. 3), in one or more embodiments. The method further includes producing, outputting and/or generating the offset voltage (e.g., VC_OS in FIG. 3) across a drain of the third transistor (e.g., the transistor 320 in FIG. 3) and a source of the fourth transistor (e.g., the transistor 330 in FIG. 3), in one or more embodiments. The generated offset voltage is configured to be process and temperature dependent, in one or more embodiments so that the difference between the threshold voltage and the offset voltage is a constant, e.g., process and temperature independent (see Equation 1-Equation 6).

Referring now to operation 407, and in one or more embodiments, the offset voltage (e.g., VC_OS 225 in FIG. 2) is applied and/or provided across a gate of the second transistor (e.g., the transistor MP2 in FIG. 2) and a source of the first transistor (e.g., the transistor MP1 in FIG. 2). In one or more embodiments, the offset voltage 225 may be applied and/or provided across the gate of the second transistor MP2 and the source of the first transistor MP1 so that the offset voltage 225 preloads the signal detector input and reduces the minimum required input signal to trigger the detection (e.g., the reduced minimum required input signal or new signal detection threshold is (Vth−VC_OS)). Similarly, the offset voltage 235 may be applied across the gate of the first transistor MP1 and the source of the second transistor MP2, in one or more embodiments so that the offset voltage 235 preloads the signal detector input and reduces the minimum required input signal to trigger, initiate or enable the detection (e.g., the reduced minimum required input signal or new signal detection threshold is (Vth−VC_OS)). In one or more embodiments, the new signal detection threshold (Vth−VC_OS) is process and temperature independent, e.g., designed to counter or compensate for Vth variation effect, thereby improving the precision of signal detection.

Referring now to operation 409, an incoming voltage signal Vsig may be received at a pair of terminals, e.g., a positive terminal 260 (TRDP) and a negative terminal 270 (TRDN), in one or more embodiments.

Referring now to operation 411, a signal may be detected based on the new signal detection threshold voltage (Vth−VC_OS), in one or more embodiments. In one or more embodiments, a signal may be detected (e.g., between the first input 211 and the second input 212 of the voltage level detector 210) when the incoming signal voltage (Vsig) is greater than or equal to the new signal detection threshold voltage (Vth−VC_OS). In one or more embodiments, in response to determination that the incoming signal voltage (Vsig) is greater than or equal to the new signal detection threshold voltage (Vth−VC_OS), a latch signal may be generated, output or produced by the voltage level detector 210 to turn on the latch circuit 215.

To improve detectability, in one or more embodiments, the following methods can be applied in addition to the above-noted methods for controlling (e.g., compensating for) the impact of process and temperature in a passive signal detector:

(1) Method 1 (technical literature): check competitor datasheets for description of signal detectors and wake up functionality, power down mode current consumption, etc.;

(2) Method 2 (chip measurements): measure signal detector threshold variations across temperature and/or measure chip current consumption variation with and without signal presented on a cable; and/or (3) Method 3 (chip de-cap/de-layer): look for circuit layout, determine if a passive or active detection circuit is being used, and if a passive detection circuit is used, apply the the above-noted methods for controlling the impact of process and temperature in a passive signal detector.

It should be noted that certain passages of this disclosure can reference terms such as "first" and "second" in connection with devices, frequencies, etc., for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components and these components can be provided on either a standalone machine or, in one or more embodiments, on multiple machines in a distributed system. In addition, the systems and methods described above can be provided as one or more computer-readable programs or executable instructions embodied on or in one or more articles of manufacture. The article of manufacture can be a floppy disk, a hard disk, a CD-ROM, a flash memory card, a PROM, a RAM, a ROM, or a magnetic tape. In general, the computer-readable programs can be implemented in any programming language, such as LISP, PERL, C, C++, C #, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A system for process and temperature compensated passive signal detection, the system comprising:
    a voltage level detector;
    a first transistor with a drain electrically connected to a first input of the voltage level detector, the first transistor having a threshold voltage of a first voltage value, wherein a threshold voltage corresponds to a minimum gate-to-source voltage to create a conducting path between source and drain terminals of a transistor; and
    a second transistor with a drain electrically connected to a second input of the voltage level detector, the second transistor having a threshold voltage of the first voltage value, wherein
    an offset voltage is applied across a gate of the first transistor and a source of the second transistor,
    the offset voltage is applied across a gate of the second transistor and a source of the first transistor,
    a difference between a threshold voltage of the first voltage value and the offset voltage is constant, and
    the offset voltage is produced using a third transistor and a fourth transistor each having a threshold voltage of the first voltage value, a supply voltage, and a plurality of resistors.

2. The system of claim 1, wherein the offset voltage is produced across a drain of the third transistor and a source of the fourth transistor.

3. The system of claim 2, wherein the drain of the third transistor is connected to a gate of the third transistor.

4. The system of claim 2, wherein the drain of the fourth transistor is connected to a gate of the fourth transistor.

5. The system of claim 1, wherein the plurality of resistors comprises a first pair of resistors each with resistance of a first resistance value, a second pair of resistors each with resistance of a second resistance value, and a third pair of resistors each with resistance of a third resistance value.

6. The system of claim 1, wherein the offset voltage is configured to be process and temperature dependent.

7. A method for performing process and temperature compensated passive signal detection, the method comprising:
    electrically connecting a drain of a first transistor to a first input of a voltage level detector, the first transistor having a threshold voltage of a first voltage value, wherein a threshold voltage corresponds to a minimum gate-to-source voltage to create a conducting path between source and drain terminals of a transistor;

electrically connecting a drain of a second transistor to a second input of the voltage level detector, the second transistor having a threshold voltage of the first voltage value;

applying an offset voltage across a gate of the first transistor and a source of the second transistor; and applying the offset voltage across a gate of the second transistor and a source of the first transistor, wherein a difference between a threshold voltage of the first voltage value and the offset voltage is constant, and the method further comprises producing the offset voltage using a third transistor and a fourth transistor each having a threshold voltage of the first voltage value, a supply voltage, and a plurality of resistors.

8. The method of claim 7, comprising producing the offset voltage across a drain of the third transistor and a source of the fourth transistor.

9. The method of claim 8, further comprising connecting the drain of the third transistor to a gate of the third transistor.

10. The method of claim 8, further comprising connecting the drain of the fourth transistor to a gate of the fourth transistor.

11. The method of claim 7, wherein the plurality of resistors comprises a first pair of resistors each with resistance of a first resistance value, a second pair of resistors each with resistance of a second resistance value, and a third pair of resistors each with resistance of a third resistance value.

12. The method of claim 7, wherein the offset voltage is configured to be process and temperature dependent.

13. Circuitry comprising:

voltage level detector circuitry configured to detect a voltage level;

a first transistor with a drain electrically connected to a first input of the voltage level detector circuitry, the first transistor having a threshold voltage of a first voltage value, wherein a threshold voltage corresponds to a minimum gate-to-source voltage to create a conducting path between source and drain terminals of a transistor; and a second transistor with a drain electrically connected to a second input of the voltage level detector circuitry, the second transistor having a threshold voltage of the first voltage value, wherein an offset voltage is applied across a gate of the first transistor and a source of the second transistor, the offset voltage is applied across a gate of the second transistor and a source of the first transistor, a difference between a threshold voltage of the first voltage value and the offset voltage is constant, and the offset voltage is produced using a third transistor and a fourth transistor each having a threshold voltage of the first voltage value, a supply voltage, and a plurality of resistors.

14. The circuitry of claim 13, wherein the offset voltage is produced across a drain of the third transistor and a source of the fourth transistor.

15. The circuitry of claim 14, wherein the drain of the third transistor is connected to a gate of the third transistor.

16. The circuitry of claim 15, wherein the drain of the fourth transistor is connected to a gate of the fourth transistor.

17. The circuitry of claim 13, wherein the plurality of resistors comprises a first pair of resistors each with resistance of a first resistance value, a second pair of resistors each with resistance of a second resistance value, and a third pair of resistors each with resistance of a third resistance value.

\* \* \* \* \*